June 1, 1965

D. K. ALLISON 3,187,082

HEAT DISSIPATING ELECTRICAL SHIELD

Filed Feb. 1, 1961

INVENTOR.
DONALD K. ALLISON
BY Fulwider, Mattingly & Huntley
Attorneys

United States Patent Office 3,187,082
Patented June 1, 1965

3,187,082
HEAT DISSIPATING ELECTRICAL SHIELD

Donald K. Allison, Albuquerque, N. Mex., assignor to Cool Fin Electronics Corporation, Los Angeles, Calif., a corporation of Nevada Filed Feb. 1, 1961, Ser. No. 86,537
5 Claims. (Cl. 174—35)

This is a continuation-in-part of application Serial No. 814,091 filed May 18, 1959, now Patent No. 3,023,264, and application Serial No. 66,652, filed November 1, 1960, now Patent No. 3,057,950.

The present invention relates to the electronic arts, and more particularly to heat dissipating, electrical shields for electronic components such as vacuum tubes, transistors, diodes, rectifiers, etc.

The so-called "tube shields" of contemporary practice have been designed primarily for shielding for electron tube elements from ambient fields and thereby to prevent undesired feedback, oscillation, interference and noise. Such shields reflect and retain the heat generated by operation of the tube within the tube envelope, greatly increasing the operating temperatures within the tube and seriously decreasing tube life and operating reliability.

In my prior applications, I have disclosed heat dissipating, electrical shields which combine effective shielding and superior heat dissipation by means of fins extending outwardly from the shield to provide heat dissipating elements which greatly augment the heat dissipating surface of the shield. According to the present invention there is provided an improved heat dissipating, electrical shield of efficient and economical form which incorporates certain of the broader concepts of my prior applications, above identified, in a new and relatively low cost structure.

An object of the present invention is the provision of an improved and economical heat dissipating, electrical shield for electronic components.

Another object of the invention is the provision of a shield for an electronic component such as a vacuum tube, having improved heat dissipating means for lowering the operating temperature within the tube.

A further object of the invention is the provision of a heat dissipating, electrical shield for an electronic component which will effectively shield the tube elements from ambient electrical fields, provide additional heat dissipating surfaces projecting outwardly from the shield, and expose portions of the envelope for the component to the ambient.

A still further object of the invention is the provision of an improved heat dissipating, electrical shield for an electronic component including a tubular portion and a liner therefor contacting the envelope of the component and extending through the tubular member to provide additional heat radiating surfaces exteriorly thereof so as to lower the operating temperature of the elements within the tube.

These and other objects and features of the invention will be readily apparent to those skilled in the art from the following specification of presently preferred embodiments of the invention and the appended drawings thereof, in which.

Figures 1, 2, 3, 4, 5, 6, 7:
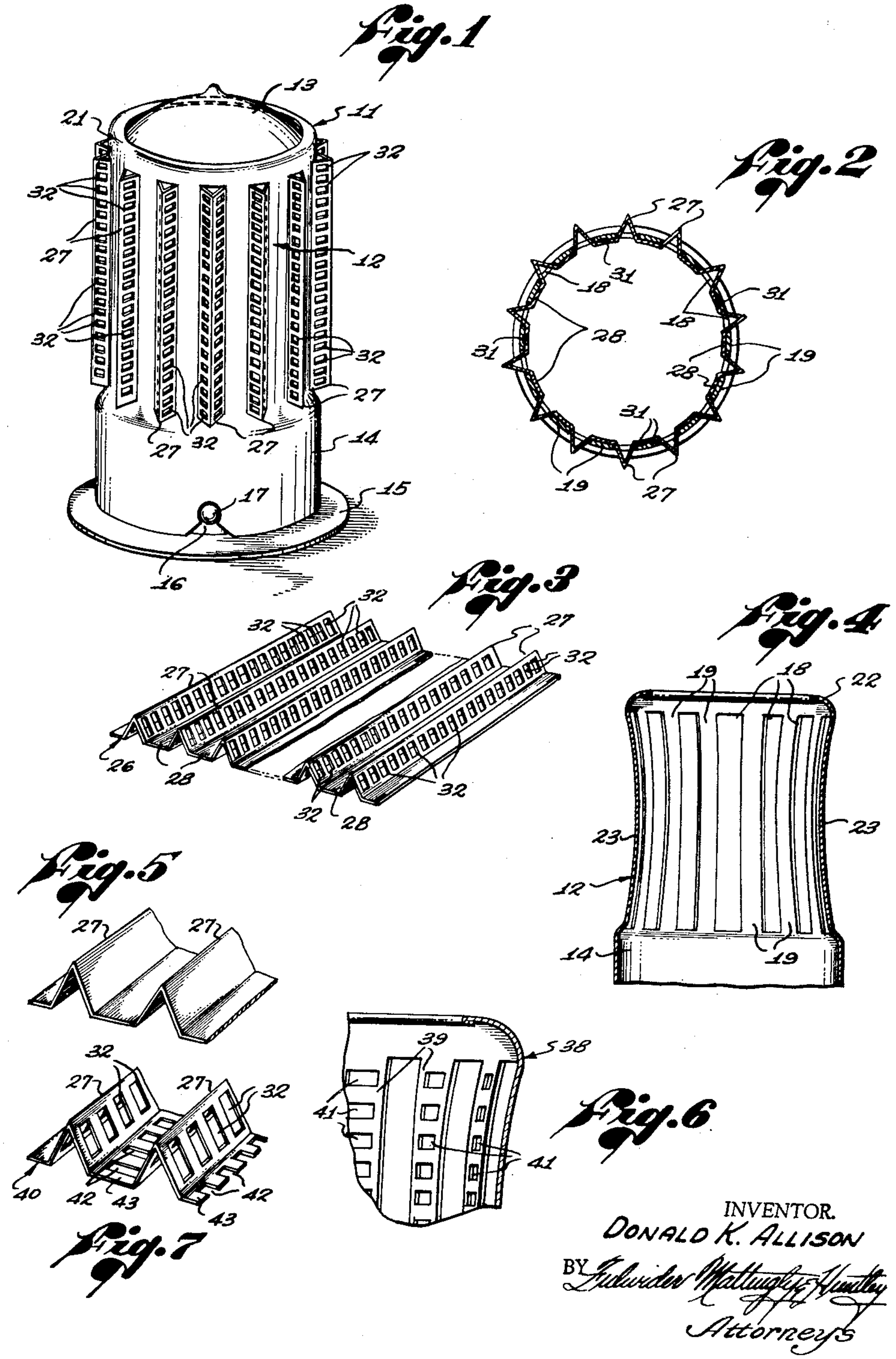
FIGURE 1 is a perspective view of a heat dissipating, electrical shield according to the present invention shown in place about an electronic tube.
FIGURE 2 is a transverse sectional view through the shield of FIGURE 1.
FIGURE 3 is a perspective view showing the shield liner before insertion in the outer tubular member.
FIGURE 4 is a vertical sectional view of the outer tubular member of the shield before the assembly of the liner of FIGURE 3 therewith.
FIGURE 5 is a partial, enlarged, perspective view showing a modified form of shield liner without openings therethrough.
FIGURE 6 is an enlarged, partial, perspective view of a further modified shield liner having openings through the tube envelope engaging portions thereof.
FIGURE 7 is a partial vertical sectional view similar to FIGURE 4 but showing a modified form of tubular member adapted to cooperate with the liner of FIGURE 6.

The heat dissipating, electrical shield according to the present invention, as illustrated in FIGURES 1 through 4, includes an outer tubular member 11 shown in vertical section in FIGURE 4. The tubular member 11 includes an upper portion 12 surrounding the glass envelope of an electronic tube 13 and a depending skirt 14 integral with the portion 12 and, as shown in FIGURE 1, in electrical and heat conducting contact with a metallic socket ring 15 mounted on the chassis of an electronic device, not shown. The skirt 14 has a slot 16 interlocking with a button 17 mounted on the socket ring 15. The portion 12 of the tubular member 11 is provided with a plurality of longitudinally extending, peripherally spaced slots 18 leaving longitudinally extending straps 19 forming a cage-like structure and extending from an upper and integral ring portion 21 to the depending skirt 14. The edge of the ring portion 21 is bent inwardly at 22 to engage the top of the glass envelope of the electronic tube 13, so that the tubular member 11 also serves to mechanically hold the tube 13 in its socket. Each of the longitudinally extending straps 19 is bowed inwardly, as shown at 23 in FIGURE 4, to a diameter, across opposite straps, less than the diameter of the envelope of the tube 13 whereby the straps 19 are moved outwardly when the shield is mounted on the tube 13 and exert a substantial pressure thereon through the shield liner.

A heat dissipating and electrically shielding liner for the tubular member 11 is shown in FIGURE 3. This liner 26 is formed from a sheet metal strip having V-shaped elements 27 bent outwardly therefrom and spaced apart by flat portions 28, in the plane of the original strip, which have a width substantially equal to the width of the straps 19 on the tubular member 11. The length of the liner 26 is substantially equal to the internal circumference of the tubular member 11. The liner 26 is inserted interiorly of the tubular member 11, as shown in FIGURE 2, with the V-shaped elements 27 extending through the slots 18 and projecting outwardly of the exterior surface of the tubular member 11. The V-shaped elements 27 form heat dissipating fins extending outwardly of the portion 12 of the tubular member 11. After being mounted within the tubular member 11 with the V-shaped elements 27 extending through the slots 18, the liner 26 is electrically welded or tacked to the member at spaced points, for example, at the points 31 of FIGURE 2. The V-shaped fin elements 27 are provided with a multiplicity of transversely extending slots 32 in the opposite legs thereof, exposing therethrough the glass envelope of the electronic tube 13.

When the tubular member 11 is mounted upon an electronic tube as at 13, the straps 19 are straightened against their inherent resiliency, since the diameter at the bows 23 is less than the exterior diameter of the tube envelope. This movement is readily accommodated in the liner 26 by widening of the base of the V-shaped fins 27. The portions 28 of the liner 26 are thereby pressed into intimate heat conducting relation with the exterior surface of the tube envelope. Heat generated in the operation of the tube 13 is then conducted directly from the exterior surface of its envelope to the portions 28 of the liner 26 and thence to the V-shaped fin elements 27, the straps 19 and the member 11. From all of the surfaces of the shield, heat is radiated or dissipated to lower the temperature of the tube envelope and hence the temperature of the operating elements within the tube. The V-shaped fins 27, extending exteriorly of the tubular member 11, greatly augment the heat dissipating surface over that provided by a cylindrical shield alone.

The slots 32 expose the glass envelope of the tube 13 to the exterior and through these slots infrared rays will pass directly to the ambient surrounding the tubular member 11 and will thus serve to further lower the temperature of the operating elements within the tube.

The tubular member 11 is grounded to the chassis of the electronic equipment through the skirt 14 and the socket ring 15 connected to the chassis and thus serves to shield the tube operating elements from ambient electrical fields. Heat is also dissipated by conduction through the skirt 14 and socket ring 15 to the heat sink provided by the equipment chassis which will ordinarily be at a lower temperature than the envelope of the electronic tube 13.

FIGURE 5 shows a liner 35 in which the V-shaped fin elements 36 are solid, the liner 35 differing from the liner 26 only in the omission of the slots 32. In this type of liner the direct radiation of infrared through the tube envelope to the ambient does not take place and the cooling is not as great nor as efficient as that provided in the structure of FIGURES 1 through 4, which provides for direct radiation through the slots 32.

In the form of the invention illustrated in FIGURES 6 and 7, a tubular member 37 is substituted for the tubular member 11, differing therefrom only in that the longitudinally extending straps 39 of the tubular member 38 are provided with a plurality of transverse slots 41 similar to the slots 32. Cooperating with the tubular member 38 is a liner 40 (FIGURE 6) having V-shaped heat dissipating fins 27 and slots 32 therethrough and, in addition, slots 42 in the spacing portions 43 conforming to the spacing portions 28 of the liner 26. The slots 42 are disposed to mate with the slots 41 in the straps 39 when the liner 40 is assembled with the tubular member 38, thus exposing additional portions of the glass envelope of the tube 13 for radiation therethrough to the ambient. Otherwise, the heat dissipating shield of FIGURES 6 and 7 operates the same as that of FIGURES 1 through 4.

It will be apparent that the preferred embodiment of FIGURES 1 through 4 and the modification of FIGURES 6 and 7 take advantage of the increased transmissivity of glass to infrared radiation upon increase in temperature, thus increasing the heat radiated from the operating elements of the tube through the slots in the shield as the temperature of the glass envelope increases with increase in the ambient temperature.

While certain preferred embodiments of the invention have been specifically shown and described it will be understood that the invention is not limited thereto as many variations will be apparent to those skilled in the art and the invention is to be given its broadest interpretation within the terms of the following claims.

I claim:

1. A heat dissipating, electrical shield for electronic components comprising: an electrical and heat conducting member adapted to be placed over the envelope of an electrical component and having slots extending through a component enclosing portion thereof; a liner within at least said portion of said member having portions engaging inner surfaces of the member between said slots so as to be pressed against the component envelope in good heat conducting relation therewith, the parts of said liner opposite said slots being return-bent outwardly and projecting through said slots to form heat dissipating fins extending outwardly of said member; and slots in said fins exposing the component envelope therethrough.

2. A heat dissipating, electrical shield for electronic components comprising: an electrical and heat conducting member adapted to be placed over the envelope of an electrical component and having slots extending through a component enclosing portion thereof; a liner within at least said portion of said member having portions engaging inner surfaces of the member between said slots so as to be pressed against the component envelope in good heat conducting relation therewith, the parts of said liner opposite said slots being return-bent outwardly and projecting through said slots to form heat dissipating fins extending outwardly of said member; and mating slots in said member and said liner also exposing said component envelope therethrough.

3. A heat dissipating, electrical shield for electronic components comprising: a generally tubular member having peripherally spaced, longitudinally extending slots therethrough and adapted to receive an electrical component therein; and a liner within said tubular member having peripheral portions engaging the inner surfaces of said tubular member between said slots, the portions of said liner between said peripheral portions being return-bent outwardly and projecting through the slots in said member to form heat dissipating fins extending outwardly of said member, the portions of the tubular member between said slots being longitudinally bowed inwardly so as to press said peripheral portions of the liner against the envelope of the electronic component in good heat conducting relation therewith.

4. A heat dissipating, electrical shield for electronic components comprising: a generally tubular member having peripherally spaced, longitudinally extending slots therethrough and adapted to receive an electrical component therein; and a liner within said tubular member having peripheral portions engaging the inner surfaces of said tubular member between said slots, the parts of said liner between said peripheral portions being return-bent outwardly and projecting through the slots in said member to form heat dissipating fins extending outwardly of said member, said fins having transversely extending slots therein exposing the envelope of the electronic component therethrough.

5. A heat dissipating, electrical shield for electronic components comprising: a generally tubular member having peripherally spaced, longitudinally extending slots therethrough and adapted to receive an electrical component therein; a liner within said tubular member having peripheral portions engaging the inner surfaces of said tubular member between said slots, the portions of said liner between said peripheral portions being return-bent outwardly and projecting through the slots in said member to form heat dissipating fins extending outwardly of said member, said fins having transversely extending slots therein exposing the envelope of the electronic component therethrough; and mating transverse slots through said peripheral portions of the liner and through the parts on said member between said slots also exposing the envelope of the electronic component through said mating transverse slots.

References Cited by the Examiner

UNITED STATES PATENTS

| | | | |
|---|---|---|---|
| 2,112,743 | 3/38 | Poole | 165—185 |
| 2,499,612 | 3/50 | Staver | 174—35 |
| 2,635,131 | 4/53 | Greatbatch | 174—35 X |
| 2,904,772 | 9/59 | Artz | 174—35 |
| 2,905,742 | 9/59 | Woods | 174—35 |
| 3,057,950 | 10/62 | Allison | 174—35 |

FOREIGN PATENTS

| | | |
|---|---|---|
| 714,299 | 8/54 | Great Britain. |
| 854,296 | 11/60 | Great Britain. |

E. JAMES SAX, *Primary Examiner.*

DARRELL L. CLAY, JOHN P. WILDMAN, *Examiners.*